United States Patent [19]

Betts et al.

[11] 4,037,226

[45] July 19, 1977

[54] PULSE CODE MODULATION COMPRESSOR

[75] Inventors: William L. Betts; Robert T. Greene, both of St. Petersburg, Fla.

[73] Assignee: NCR Corporation, Dayton, Ohio

[21] Appl. No.: 647,298

[22] Filed: Jan. 7, 1976

[51] Int. Cl.² .............................................. H04L 3/00
[52] U.S. Cl. ............................................. 340/347 DD
[58] Field of Search .............. 340/347 DD; 325/38 R, 325/38 B

[56] References Cited

PUBLICATIONS

Janus, "IBM Technical Disclosure Bulletin" vol. 14, No. 1, June 1971, p. 303.

*Primary Examiner*—Charles D. Miller
*Attorney, Agent, or Firm*—J. T. Cavender; Edward Dugas

[57] ABSTRACT

A pulse code modulation compressor converts linear pulse code modulation words into companded pulse code modulation words. A read only memory is loaded with a conversion table and used to perform successive approximations for the conversion. The converted output is then passed through a double buffer to allow independent operation of the conversion clock and output clock.

5 Claims, 3 Drawing Figures

PULSE CODE MODULATION COMPRESSOR

BACKGROUND OF THE INVENTION

1. Field of the Invention

The present invention relates to digital code conversion and more particularly to a digital code compressor for converting linear pulse code modulation signals into companded pulse code modulation signals.

2. Description of the Prior Art

In pulse code modulation (PCM) systems a very common technique to improve dynamic range (signal to quantization noise ratio vs. input signal level) is called companding. A compandor consists of a pair of gain-adjusting circuits which act to maintain a more favorable signal-to-noise ratio over a transmission channel. At the input of such a channel, one unit compresses the amplitude range of the voice signal. The narrowed range enables transmission through a noisy facility at a relatively high level without overloading. At the channel output a complementary unit expands the amplitude range to that of the original input.

Another advantage to companding is that the same dynamic range can be achieved in a companding system with less digits in the PCM codeword than a linear PCM system. This advantage reduces the bandwidth of the signal that is transmitted over the transmission channel. The compression of the signal can be done before coding (analog compression), during coding (by non-linear coders) or after coding (digital compression).

When converting one digital format to another, in some cases there is the need to expand the companded format to a linear format because in the conversion process arithmetic operations must be performed. For example, in the continuous variable slope delta (CVSD) modulation to PCM conversion the companded PCM (CPCM) must be expanded to linear PCM (LPCM) so that the arithmetic algorithms of the CVSD/PCM conversion could be performed.

In the past various code conversion systems have been devised. These prior art systems such as U.S. Pat. No. 3,863,248, issued Jan. 28, 1975, for "A Digital Compressor Expander," utilized arithmetic combined with look-up techniques. The present invention uses the principal of rapid, successive approximation. It makes possible relative simplicity of circuitry.

SUMMARY OF THE INVENTION

It is an object of the present invention to provide a new and improved linear pulse code modulation to companded pulse code modulation converter.

Another object is to provide a pulse code modulation converter which uses a series of companded pulse code modulation words which are utilized as addressees in a memory look-up table until a match is found between the output of the look-up table memory and the incoming linear pulse code modulation word.

BRIEF DESCRIPTION OF THE DRAWINGS

These and other objects of the invention will become apparent from the following description taken in connection with the drawings, in which.

DESCRIPTION OF THE PREFERRED EMBODIMENT

Figure 1:
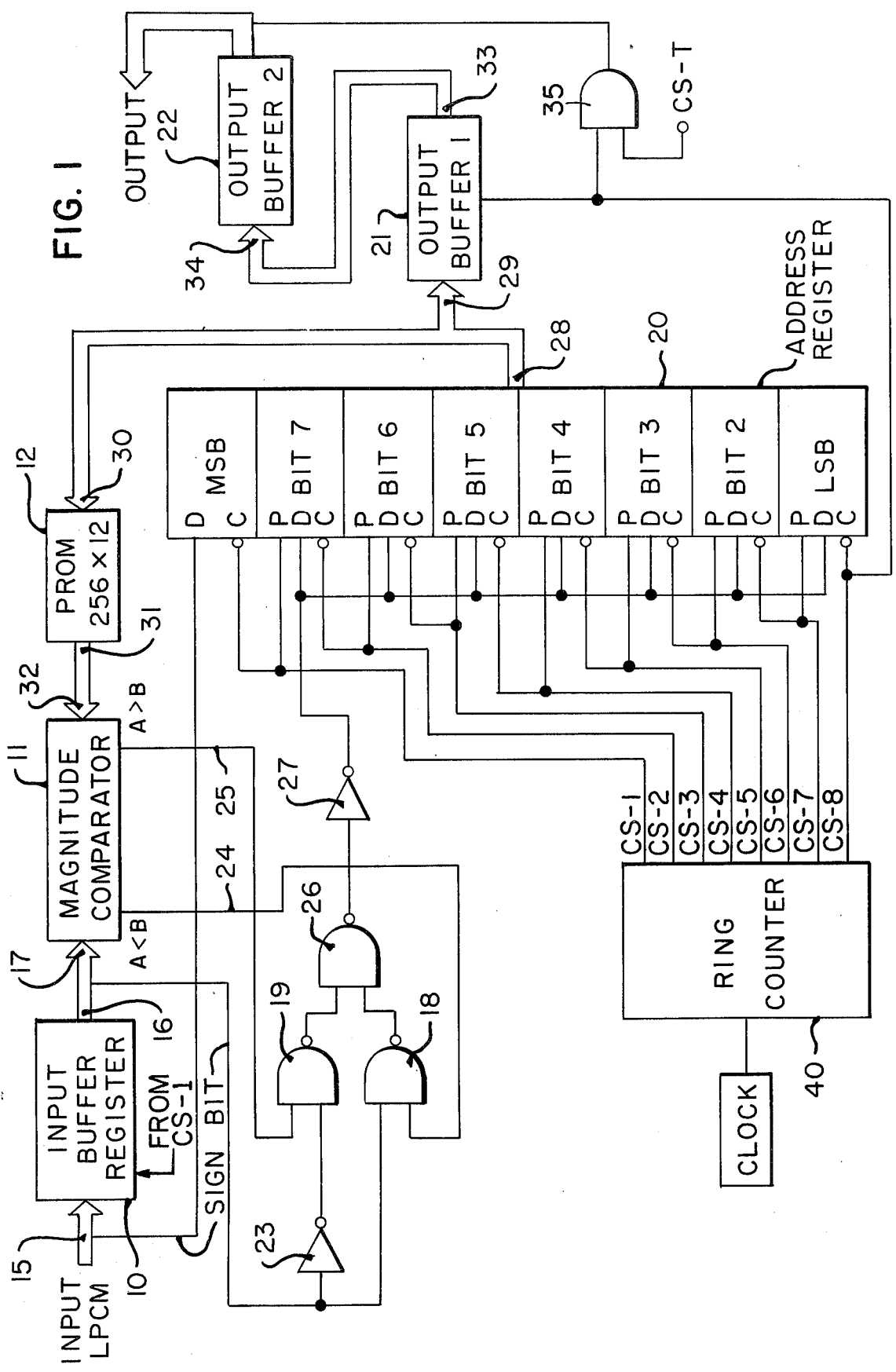
FIG. 1 is a schematic diagram of the preferred embodiment of the invention.

While this invention is susceptible of embodiments in many different forms, there is shown in the drawings and will herein be described in detail, an embodiment of the invention with the understanding that the present disclosure is to be considered as an exemplification of the principals of the invention and are not intended to limit the invention to the embodiment illustrated. The scope of the invention will be pointed out in the appended claims.

Figure 3:
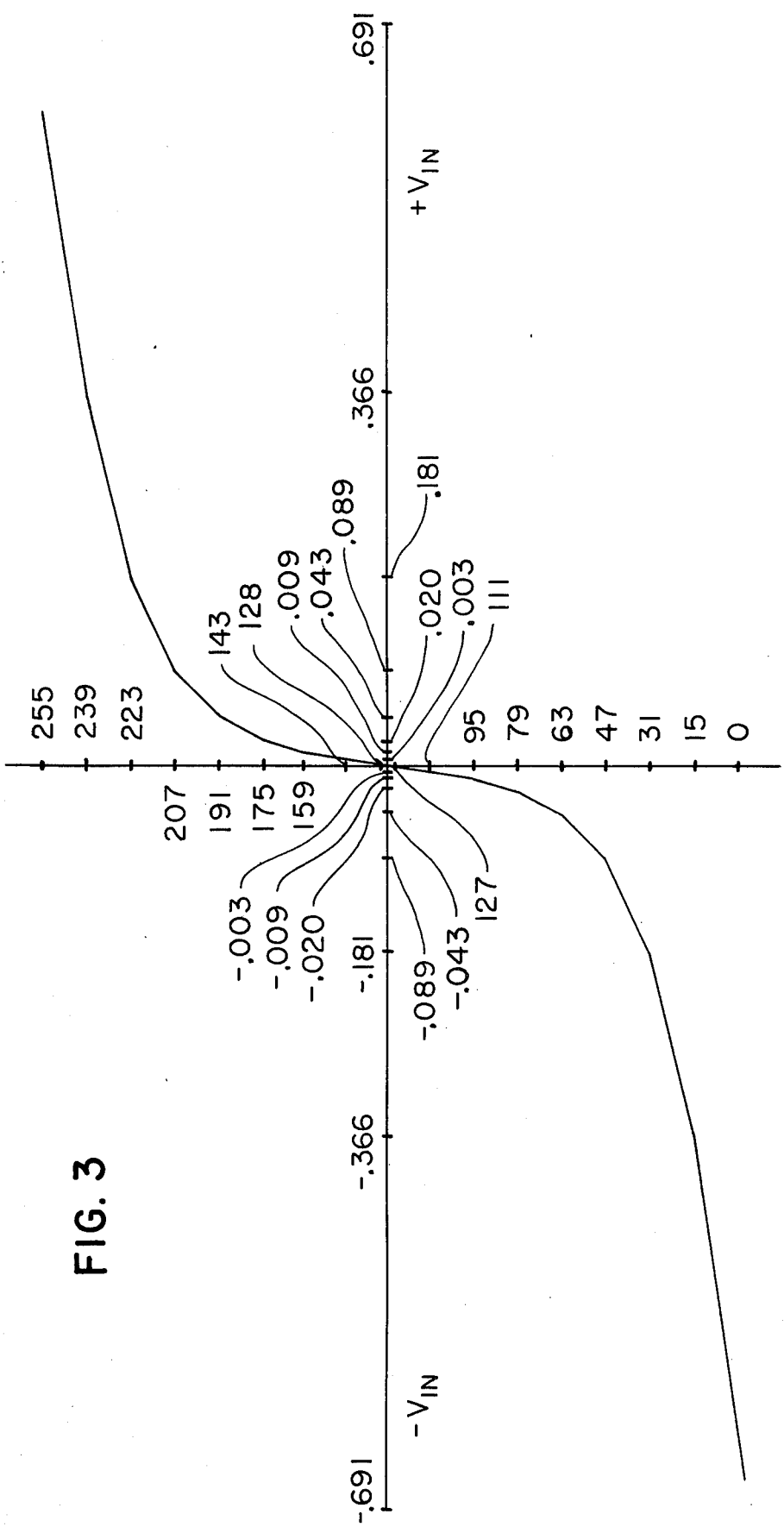
FIG. 3 is a graph of a 15 segment efficiently digitally linearizable companded code utilized by the embodiment of the invention illustrated in FIG. 1.

A companded format of an 8 bit 15 segment efficiently digitally linearizable companded code is illustrated in FIG. 3. The digital linear expansion of the companded format requires digital code words of 14 bits. A CPCM to LPCM (8 bits to 14 bits) conversion can readily be accomplished with programmable read only memories (PROM's) since the word length of the CPCM codeword is 8 bits. But to use this technique in the LPCM to CPCM direction, $2^{14} = 16,384$ memory locations would be required. A PCM code compressor has a form of successive approximation in conjunction with a magnitude comparator and a 256 $\times$ 16 bit programmable read only memory (PROM). The size of the PROM gives the compressor the capability of compressing a 16 bit codeword down to an 8 bit codeword.

An algorithm establishes a point to point relationship between the linear PCM word and the 8 bit companded PCM word. The PROM is programmed to contain the linear PCM word with the companded PCM word used as the address.

Figure 2:
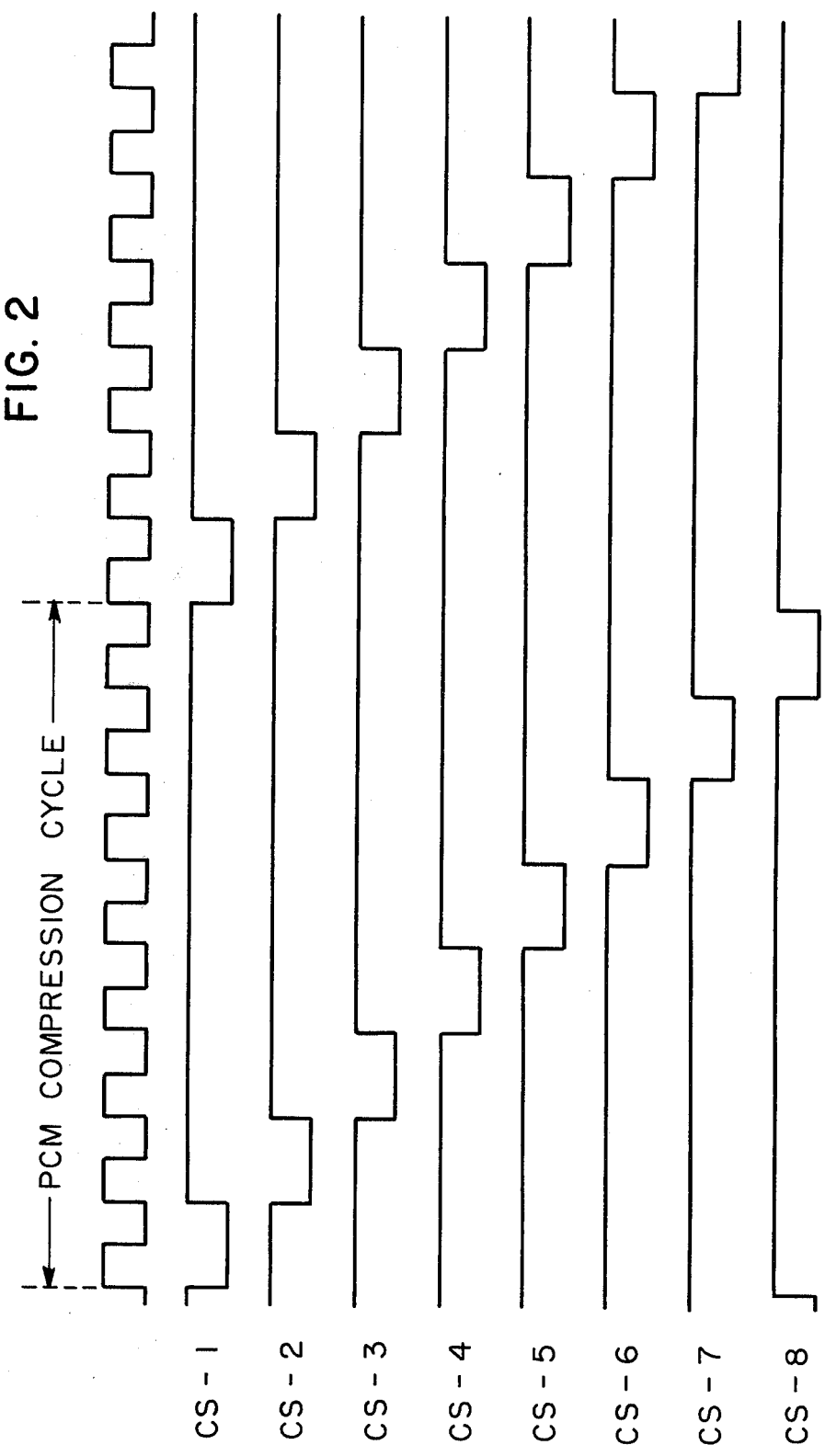
FIG. 2 is a timing diagram utilized by the preferred embodiment of the invention illustrated in FIG. 1.

FIG. 1 shows a block diagram of the PCM compressor and FIG. 2 is its timing diagram. Blocks of data (PCM words) are shifted into and out of the compressor at the PCM word rate. Therefore, the LPCM and the CPCM codewords must have the same word rate. The clock going to the PCM compressor is equal to the word rate times the number of bits in the CPCM codeword. This clock goes to a ring counter which generates a phase for each bit in the CPCM codeword.

The PCM compressor consists of a LPCM input buffer register 10, a magnitude comparator 11, a programmable read only memory 12 with $2^n$ addresses, where $n$ is the number of bits in the CPCM word, an address register $n$ bits long 20 and two output buffer registers 21 and 22 each $n$ bits long.

The input buffer register 10 receives linear pulse code modulation (LPCM) words at an input generally indicated at 15. An output generally indicated at 16 of the input buffer register 10 is connected to A input generally indicated at 17 of the magnetic comparator 11. The sign bit line in the output 16 is connected to a NAND gate 18 and to a NAND gate 19 through an inverter 23. The NAND gate 18 has a second input connected to an A<B output 24 of magnetic comparator 11. NAND gate 19 has a second input connected to an A<B output 25 of comparator 11. The outputs of gate 18 and gate 19 are inputs to a NAND gate 26. The output of the NAND gate 26 is connected to bit cells of the shift register 20 as will be more fully described herein. A CPCM word output generally indicated at 28 is connected to an input 29 of a buffer 21 and to an input generally indicated at 30 of PROM 12. An output, generally indicated at 31, of PROM 12 is connected to B input, generally indicated at 32, of the magnetic comparator 11.

The output of buffer register 21, generally indicated at 33, is connected to an input, generally indicated 34, of the buffer register 22. The compressor output is taken from the output of the buffer register 22.

The timing source is a ring counter 40 whose outputs are CS-1 through CS-8. The address register 20 has eight bit cells indicated LSB, bit 2 through 7, and MSB. The number of clock pulses required for a full PCM compression cycle is equal to the number of bits in a CPCM codeword. CS-1 sets the input initial conditions of inserting the LPCM codeword into the input buffer register 10, setting the first "guess" into address bit 7, setting the sign bit into the MSB of the address register 20, and clearing address bits 1 through 6. After the initial conditions are set, CS-2 through GS-7 are then used to preset address registers bits 1 through 7 with "guesses" and then clock in the correct answer after the comparison has been made with the input LPCM codeword. CS-8 is used to clock the correct answer into the LSB of the address register and also clock the CPCM codeword into the first output buffer register 21.

The 256 × 16 (of which only 12 are utilized) bit PROM is programmed in the same manner as the CPCM to LPCM conversion. The output of the PROM is compared with the input LPCM codeword. The input LPCM codeword is applied to the A input 17 of the magnitude comparator. The output 31 of the PROM is applied to the B input.

The primary cycle in the PCM compression technique is to preset an address register bit to a 1 which is called a "guess." The contents of the address are then compared with the input LPCM codeword in the magnitude comparator. A logic network is connected to the outputs of the magnitude comparators to detect a condition of convergence. If the particular "guess" is converging towards the input LPCM codeword, then the bit for that particular address position remains unchanged. If a condition of divergence is detected, then the address bit is complemented.

Referring to FIG. 2, a step-by-step procedure for a compression cycle is given below:

1. The leading edge of CS-1 shifts the codeword into the input buffer register, and shifts the sign bit from the LPCM codeword into the MSB of the address register.

2. The clock pulses are normally high going low, as CS-1 goes low it presets a 1 into bit 7 of the address register.

3. The logic network ($Y = A\overline{S} + BS$, where $Y$ is logic network output, $A = A > B, B = A < BS$ = LPCM sign bit) detects a condition of convergence when the input LPCM codeword is compared to the first "guess." A condition of convergence is where $Y = 1$, a condition divergence is where $Y = 0$.

4. The leading edge of CS-2 sets the correct answer into bit 7 of the address register and presets bit 6.

5. Step 3 is repeated and CS-3 sets the correct answer into bit 6 of the address register and presets bit 5.

6. Steps 3, 4, and 5 are repeated for CS-4 through CS-7.

7. The leading edge of CS-8 sets the LSB of the address register to the correct answer.

When converting from one code format to another, two asynchronous timing sources are involved. The trailing edge of CS-8 shifts the CPCM codeword into output buffer register 21. CS-T is a control signal from another timing source. CS-T and CS-8 are used in conjunction with each other to prevent data from being shifted into the second buffer register 22 while data is changing state in the first buffer register 21.

A listing of the code conversion mappings illustrated in FIG. 3, between the CPCM code format and the LPCM code is particularly set forth in the following table. The example given here will take a LPCM codeword through the compression cycle and show how this codeword is converted into its corresponding CPCM codeword. The PROM 12 gives the compressor the capability of compressing a 16 bit word down to an 8 bit codeword. In this application, only 12 bits are used. The only effect this has on the circuit is that 4 bits in the PROM 12 go unused.

TABLE

CODE CONVERSION MAPPINGS — CPCM TO LPCM

This mapping is for end points which is the CVSD to PCM direction.

| CPCM CODE LEVEL | CPCM CODE WORD | LPCM CODE LEVEL | LPCM CODE WORD |
|---|---|---|---|
| 255 | 10000000 | 2040 | 011110111000 |
| 254 | 10000001 | 1976 | 011111111000 |
| 250 | 10000101 | 1720 | 011010111000 |
| 236 | 10010011 | 920 | 001110011000 |
| 200 | 10110111 | 192 | 000011000000 |
| 150 | 11101001 | 15 | 000000001111 |
| 129 | 11111110 | 1 | 000000000001 |
| 128 | 11111111 | 0 | 000000000000 |
| 126 | 01111110 | −1 | 111111111111 |
| 127 | 01111111 | 0 | 000000000000 |
| 100 | 01100100 | −20 | 111111101100 |
| 50 | 00110010 | −232 | 111100011000 |
| 0 | 00000000 | −2040 | 100000001000 |
| 1 | 00000001 | −1976 | 100001001000 |

Select an input LPCM word of 001110011000. This is LPCM code level 920 which corresponds to CPCM code level 26 — 10010011.

1. CS-1 clears bits 1 through 6, sets the LPCM sign bit into the MSB and presets bit 7 to a 1. The $\overline{Q}$ output is taken from the MSB so the sign bit becomes complemented. The first "guess" is: 11000000. The LPCM word corresponding to this "guess" is: 000001111000. This codeword and the input codeword are compared.
$A = 1 \quad B = 0 \quad S = 0$
$Y = A\overline{S} + BS = 0$ 2. Since $Y = 0$ CS-2 complements bit 7 and presets bit 6. The second "guess" is: 10100000. The LPCM word corresponding to this "guess" is: 000111111000. This codeword and the input codeword are compared.
$A = 1 \quad B = 0 \quad S = 0$
$Y = A\overline{S} + BS = 0$ 3. Since $Y = 0$, CS-3 complements bit 6 and presets bit 5. The third "guess" is: 10010000. The LPCM word corresponding to this "guess" is: 001111111000. This codeword and the input codeword are compared.
$A = 0 \quad B = 1 \quad S = 0$
$Y = A\overline{S} + BS = 1$ 4. Since $Y = 1$, CS-4 does not complement bit 5 and presets bit 4. The fourth "guess" is: 10011000. The LPCM word corresponding to this "guess" is: 001011111000. This codeword and the input codeword are compared.
$A = 1 \quad B = 0 \quad S = 0$
$Y = A\overline{S} + BS = 0$ 5. Since $Y = 0$, CS-5 complements bit 4 and presets bit 3. The fifth "guess" is: 10010100. The CPCM word corresponding to this "guess" is: 001101111000. This codeword and the input codeword are compared.

$$A = 1 \quad B = 0 \quad S = 0$$
$$Y = A\overline{S} + B\overline{S} = 0$$

6. Since $Y = 0$, CS-6 complements bit 3 and presets bit 2. The sixth "guess" is: 10010010. The LPCM word corresponding to this "guess" is: 001110111000. This codeword and the input codeword are compared.

$$A = 0 \quad B = 1 \quad S = 0$$
$$Y = A\overline{S} + B\overline{S} = 1$$

7. Since $Y = 1$, CS-7 does not complement bit 2 and presets the LSB. The seventh "guess" is: 10010011. The LPCM word corresponding to this "guess" is: 001110011000. This codeword and the input codeword are compared.

$$A = 0 \quad B = 0 \quad S = 0$$

$$Y = A\overline{S} + B\overline{S} = 1$$

8. Since $Y = 1$, CS-8 does not complement the LSB. The final CPCM codeword is 10010011. Referring to the table this codeword corresponds to the input LPCM codeword. The trailing edge of CS-8 shifts the contents of the address register 20 into output buffer register 21.

9. When the contents in the 1st output buffer register are settled, CS-T is allowed to shift the contents to the output buffer register 22. The converted CPCM codeword is now synchronized to the other timing source.

The double buffer arrangement of registers 21 and 22 perform the function of rate conversion between the receive and transmitter sections of the converter since an outside receiving circuit may not be gated at the same time as the input to buffer 21. Buffer 22 will not change state when new data is being shifted into register 21. After the data is stablized in buffer register 21 then the data is shifted into the second buffer register 22 and then is available to be inserted into other PCM data streams. This is accomplished by a connection of CS-8 to buffer 21 and to buffer 22 through an AND gate 35. The other input to the AND gate is suitable outside PCM timing pulses.

We claim:

1. A pulse code modulation compressor for companding pulse code modulation signals having a sign bit, comprising:
A. a magnitude comparator for comparing pulse code modulation signals having first and second inputs and decision outputs;
B. a first shift register connected to said first comparator input and having an input;
C. a memory having an address input and a pulse code modulation output programmed to convert compressed pulse code modulation signals to linear pulse code modulation signals, said memory output connected to said second comparator input;
D. a second shift register having a single stage set of bit cells equal in number to the number of bits in a compressed pulse code modulation word and a sign bit cell to be processed, said word bit cells connected to said comparator decision outputs;
E. a logic circuit connected between said magnitude comparator and said second shift register comprising;
1. a first NAND gate having one input terminal connected to the sign bit at said magnitude comparator first input and another input connected to one said magnitude comparator decision output;
2. a second NAND gate connected through an inverter to said sign bit at said magnitude comparator first input and having another input connected to another of said magnitude comparator decision outputs;
3. a third NAND gate having an input connected to said first NAND gate and a second input connected to said second NAND gate and having an output connected to each bit cell of said address register except the most significant bit cell through a second inverter; and
F. clock means connected to said second register to provide a series of successively more accurate memory address pulse code modulation words in said second register.

2. A pulse code modulation compressor as specified in claim 1, wherein said clock means comprises a ring counter which sends a sequence of clock signals sequentially to the set of bit cells in said address register beginning with the most significant bit cell and progressing to the least significant bit cell.

3. A pulse code modulation compressor as specified in claim 1, wherein said most significant bit cell is connected to said sign bit at said first shift register input.

4. In combination with the pulse code modulation compressor specified in claim 1, a third shift register connected to said second shift register to receive and transfer companded pulse code modulation signals generated in said second shift register.

5. In combination with the pulse code modulation compressor specified in claim 1, a fourth shift register connected to said third shift register to transfer companded pulse code modulation signals generated in said third shift register in response to an external signal and only when companded pulse code modulation signals are not being generated in said third shift register.

* * * * *